United States Patent
Tajima et al.

(10) Patent No.: US 11,547,016 B2
(45) Date of Patent: Jan. 3, 2023

(54) CONTROL PANEL UNIT FOR MACHINE TOOL

(71) Applicant: STAR MICRONICS CO., LTD., Shizuoka (JP)

(72) Inventors: Kazushige Tajima, Shizuoka (JP); Katsuhiro Shinomiya, Shizuoka (JP)

(73) Assignee: STAR MICRONICS CO., LTD., Shizuoka (JP)

( * ) Notice: Subject to any disclaimer, the term of this patent is extended or adjusted under 35 U.S.C. 154(b) by 609 days.

(21) Appl. No.: 16/687,811

(22) Filed: Nov. 19, 2019

(65) Prior Publication Data

US 2020/0198080 A1 Jun. 25, 2020

(30) Foreign Application Priority Data

Dec. 25, 2018 (JP) .............................. JP2018-240986

(51) Int. Cl.
*H05K 7/20* (2006.01)
*H05K 5/02* (2006.01)

(52) U.S. Cl.
CPC ....... *H05K 7/20145* (2013.01); *H05K 5/0213* (2013.01); *H05K 7/20* (2013.01)

(58) Field of Classification Search
CPC ..... H05K 5/0213; H05K 7/20; H05K 7/20145
USPC ................................. 454/184, 195
See application file for complete search history.

(56) References Cited

U.S. PATENT DOCUMENTS

2009/0059525 A1* 3/2009 Peng ..................... H01L 23/467
361/697

FOREIGN PATENT DOCUMENTS

| JP | S60-174404 | 11/1985 |
|---|---|---|
| JP | H5-2861 | 1/1993 |
| JP | H5-215476 | 8/1993 |
| JP | H9-140013 | 5/1997 |
| JP | 2000-190163 | 7/2000 |
| JP | 2001-358483 | 12/2001 |
| JP | 2003-174275 | 6/2003 |
| JP | 2013-083414 | 5/2013 |

OTHER PUBLICATIONS

EPO, European Search Report of EP 19211974.1 dated Jun. 9, 2020.
JPO, Office Action of the corresponding Japanese Patent Application No. 2018-240986 dated Oct. 25, 2022.

* cited by examiner

*Primary Examiner* — Vivek K Shirsat
(74) *Attorney, Agent, or Firm* — Lex IP Meister, PLLC

(57) ABSTRACT

A technology downsizing a control panel unit is provided. The control panel unit for a machine tool comprises a casing, a duct, and a fan. The casing has an openable door. A control device is arranged in an internal space, which is closed when the door is closed. The duct has a groove and a ventilation opening. The groove is closed at a closed end and open to the internal space at an open end. The ventilation opening connects the groove with the internal space in a position nearer the closed end than the open end. The duct is fixed to an inner wall of the casing in such manner as the groove faces the inner wall. The fan is mounted on the ventilation opening. The air in the internal space is taken into the groove enclosed by the inner wall and the duct by the operation of the fan.

8 Claims, 6 Drawing Sheets

CONTROL PANEL UNIT FOR MACHINE TOOL

CROSS-REFERENCE TO RELATED APPLICATION

This application claims priority of Japanese Patent Application No. 2018-240986 filed on Dec. 25, 2018. The contents of this application are incorporated herein by reference in their entirety.

BACKGROUND OF THE INVENTION

The invention relates to control panel unit having a closed internal space for use in a machine tool.

It is known that a control panel unit for a machine tool such as a lathe is provided with a cooling device to prevent overheating of a control device arranged in the internal space. When the cold outside air is taken into the internal space, an oil filter is necessarily used to catch the oil mist produced from the lubricant. The filter is necessarily often exchanged to keep desired cooling efficiency. A heat exchanger or a heat sink as a cooling alternative would make the control panel unit larger in size and higher in cost. Another cooling device using a fan is proposed in Japanese patent application publication No. 2003-174275 wherein the outside air is not taken into the internal space.

According to the publication, the control panel unit comprises a control panel box containing a control device therein and a cooling space member cooperating with a ceiling plate of the control panel box to form a cooling space box entirely covering the control panel box from above. The control panel unit further comprises a side air passage member cooperating with a side plate of the control panel box to form a vertical air passage. The ceiling plate of the control panel box has an air outlet having a circulation fan. The vertical passage connects the cooling space with an air inlet. The internal air in the control panel box enters the cooling space through the air outlet, passes down the vertical passage, and then returns to the control panel box through the air inlet.

SUMMARY

In the control panel unit disclosed in the publication, however, the cooling space is provided entirely over the control panel box, making the control panel unit larger in vertical size. Such problem resides in a control panel unit for any type of a machine tool.

The present invention relates to a technology downsizing a control panel unit for use in a machine tool.

A control panel unit for a machine tool comprises: an openable door; a casing which closes an internal space in which a control device is arranged when the door is closed; a duct having a groove and a ventilation opening, the groove being closed at a closed end and open to the internal space at an open end, the ventilation opening being provided nearer the closed end of the groove to connect the groove with the internal space, and the duct being fixed to an inner wall of the casing in such manner as the groove faces the inner wall of the casing; and a fan mounted on the ventilation opening. The air in the internal space is taken into the groove enclosed by the inner wall and the duct by the operation of the fan.

The present invention can downsize a control panel unit for use in a machine tool.

DETAILED DESCRIPTION

Figure 1:
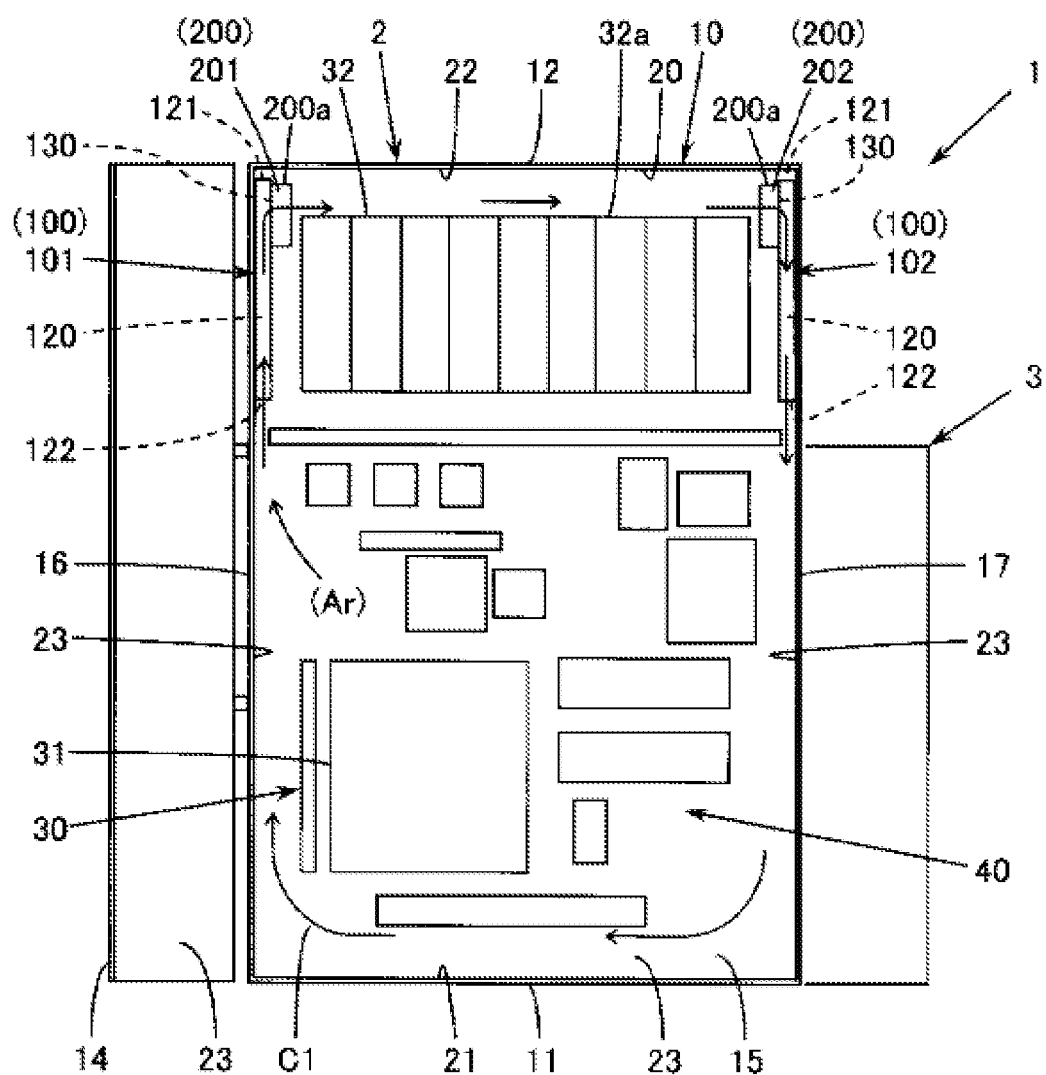
FIG. 1 schematically shows an example of a control panel unit whose door is opened.

Hereinafter, an embodiment of the present invention will be described. The invention is not limited to the exemplary embodiment and the features disclosed herein are necessarily not essential to the invention.

(1) Summary of Technology Included in the Present Invention:

Technology included in the invention will be described with reference to FIG. 1 to FIG. 6. The drawings only schematically show an example of the invention. They may have a mismatch to each other due to different magnification in each direction. Each element denoted by a symbol is only an example.

(Embodiment 1) A control panel unit 2 for use in a machine tool 1 of an embodiment of the invention comprises a casing 10, a duct 100, and a fan 200. The casing 10 is provided with an openable door 14 to close an internal space 40 in which a control device 30 is arranged. The duct 100 has a groove 120 and a ventilation opening 130. One end of the groove 120 is closed and the other end thereof is open to the internal space 40. The closed end of the groove 120 may be referred to as a closed end 121. The open end of the groove 120 may be referred to as an open end 122. The ventilation opening 130 is provided nearer the closed end 121 to connect the groove 120 with the internal space 40. The duct 100 is fixed to an inner wall 20 of the casing 10 in such manner as the groove 120 faces the inner wall 20 of the casing 10. The fan 200 is mounted on the ventilation opening 130. The air (Ar) in the internal space 40 is taken into the groove 120 enclosed by the inner wall 20 and the duct 100 when the fan 200 is operated.

The open end 122 of the groove 120 of the duct 100 is open to the internal space 40. The duct 100 is shorter than the inner wall 20 of the casing 10 with respect to an AX1 direction of the groove 120. The air (Ar) in the internal space 40 is taken into the groove 120 enclosed by the inner wall 20 and the duct 100 when the fan 200 is operated. For example, the air (Ar) in the internal space 40 may pass along the inner wall 20 of the casing 10, enter the groove 120 through the open end 122 thereof, and then flow out of the groove 120 toward the internal space 40 through the ventilation opening 130. For example, the air (Ar) in the internal space 40 may enter the groove 120 through the ventilation opening 130 and flow out of the groove 120 toward the internal space 40 through the open end 122 thereof.

The exterior of the casing 10 is exposed to the outside air of lower temperature. Heat energy of the air passing down the groove 120 is discharged to the outside air through the casing 10. The air flow is accelerated on the inner wall 20 of the casing 10 when passing down the groove 120. The faster air flow improves the heat transfer coefficient. Heat radiation to the outside air is thereby further improved. The internal space of the control panel unit can be cooled without an expensive heat exchanger or heat sink. The duct 100 can be made shorter than the inner wall 20 of the casing 10 with respect to the AX1 direction of the groove 120. The invention provides efficient heat radiation from the control panel unit without providing a cooling space box entirely covering the control panel box from above. The invention can downsize the control panel unit.

The closed internal space may be a space at least inhibiting dust or oil mist. Air flow to and from the outside is not necessarily totally cut off. The internal space connects with the outside when the door is opened. Accordingly, the closed internal space may be a space at least inhibiting dust or oil mist when the door is closed. Air flow to and from the outside is not necessarily totally cut off when the door is closed. The groove is open to the internal space to the extent that part of the internal space exists between the inner wall of the casing and the open end of the groove. The ventilation opening is nearer the one end of the groove than the other end thereof to the extent that the shortest distance between the ventilation opening and the one end of the groove is shorter than the shortest distance between the ventilation opening and the other end of the groove. The above remarks may be also applied to the following embodiments.

(Embodiment 2) The inner wall 20 may comprise a bottom 21, a ceiling 22, and an upright wall 23 connecting the bottom 21 and the ceiling 22. The duct 100 may be fixed on at least one of the upright wall 23 and the ceiling 22. Particularly, the duct 100 may be nearer the ceiling 22 than the bottom 21 when mounted on the upright wall 23. The upper air in the internal space 40 is likely higher in temperature than the lower air. The duct attached in a higher position provides further efficient heat radiation from the control panel unit. The invention can further downsize the control panel unit. The duct is nearer the ceiling than the bottom to the extent that the shortest distance between the duct and the ceiling is shorter than the shortest distance between the duct and the bottom. The above remark may be also applied to the following embodiments.

(Embodiment 3) The fan 200 may comprise an exhaust fan 201 and an intake fan 202. The exhaust fan 201 may discharge the air from the groove 120 to the internal space 40 through the ventilation opening 130. The intake fan 202 may suck the air from the internal space 40 into the groove 120 through the ventilation opening 130. The duct 100 may comprise an exhaust duct 101 and an intake duct 102. The exhaust duct 101 may be provided with the exhaust fan 201. The intake duct 102 may be provided with the intake fan 202. The intake duct 102 may be fixed on the internal wall 20 in such manner as the exhaust fan 201 faces the intake fan 202.

The air (Air) in the internal space 40 is taken into the groove 120 of the exhaust duct 101 through the open end 122 by the operation of the exhaust fan 201. The air passing down the groove 120 is discharged to the internal space 40 through the ventilation opening 130. The air is then taken into the groove 120 of the intake duct 102 through the ventilation opening 130 by the operation of the intake fan 202. The air passing down the groove 120 is discharged to the internal space 40 through the open end 122. A wider air circulation flow C1 is generated in the casing 10. Heat energy of the air in the internal space 40 is widely radiated to the outside air through the casing 10. The embodiment provides further efficient heat radiation from the control panel unit. The invention can further downsize the control panel unit.

(Embodiment 4) The duct 100 may be detachable with respect to the internal wall 20. The duct may be attached in different positions according to the control panel unit 2. The embodiment provides further efficient heat radiation according to the control panel unit. The invention can further downsize the control panel unit.

(Embodiment 5) The control device 30 may comprise an amplifier 32 which activates a driven unit. An upper end 200a of the fan 200 may be positioned above un upper end 32a of the amplifier 32. An amplifier produces a large amount of heat. Most amplifiers suck in the air from below and discharge it from above. For example, the air having higher temperature discharged toward above is sucked in the groove 120 of the duct 100 by the operation of the intake fan 202. Heat energy of the air is efficiently radiated to the outside through the casing 10. For example, the air having lower temperature in the groove 120 of the duct 100 is exhausted to the internal space 40 above the amplifier 32 by the operation of the exhaust fan 201. The air of higher temperature discharged from the amplifier 32 is not allowed to stay. The embodiment provides further efficient heat radiation from the control panel unit. The invention can further downsize the control panel unit.

(2) Configuration of the Control Panel Unit:

FIG. 1 is an illustration of the control panel unit 2 whose door 14 is opened. The illustration is only a simplified example for explanation of the invention. The invention is not limited thereto.

The machine tool 1 comprises a machining unit 3 and the control panel unit 2 which controls the operation of the machining unit 3. The machine tool 1 may be an NC (numerical control) lathe. The NC lathe may comprise a headstock having a main spindle for chucking a workpiece, a tool post provided with a tool applied to the workpiece, a driving unit which relatively moves the headstock and the tool post, and a lubricant supplier for the workpiece. The control panel unit 2 may comprise the control device 30 including a printed circuit board 31 and the amplifier 32. The printed circuit board 31 may have a circuit including a CPU (Central Processing Unit) and a semiconductor memory. The amplifier 32 may drive a motor to operate the machining unit. The control panel unit 2 controls the operation of the machining unit 3 including chucking of the workpiece, rotation of the main spindle, movement of the headstock and the tool post, and supply of lubricant. The semiconductor memory may comprise a ROM (Read Only Memory) and a RAM (Random Access Memory). The control device 30 is arranged in the internal space 40 of the casing 10 made of metal. The control device 30 produces heat when activated by externally supplied electricity. Especially, the amplifier 32 produces a large amount of heat when drives the motor to operate the machining unit. The amplifier 32 sucks in the air from below. The air of higher temperature is discharged above the amplifier 32. There may be provided a gap between the upper end 32 of the amplifier 32 and the ceiling 22 of the inner wall 20. To prevent overheat of the control device 30, the control panel unit 2 may be provided with the duct 100 having the fan 200. The duct having the fan may be referred to as the duct with fan 100.

The casing 10 may comprise a rectangular bottom plate 11 under the control device 30, a rectangular top plate 12 above the control device 30, the rectangular door 14 openable in front of the control device 30, a rectangular back plate 15 behind the control device 30, a rectangular left-side plate 16 on the left side of the control device 30, and a rectangular right-side plate 17 on the right side of the control device 30. The back plate 15, the left-side plate 16, and the right-side plate 17 are mounted on the bottom plate 11 to hold the top plate 12. The door 14 is joined to the left-side plate 16 by using a hinge. The door 14 is opened frontward and closed rearward on the hinge. The internal space 40 is opened to the air when the door 14 is opened. The internal space 40 is closed when the door 14 is closed. The casing 10 is of a box-shape made of the bottom plate 11, the top plate 12, the back plate 15, the left-side plate 16, and the right-side plate 17.

Machining the workpiece produces oil mist due to the supplied lubricant. The control panel unit needs a dust/oil filter to take the outside air (cool air) into the internal space 40. The filter is necessarily often exchanged to keep desired cooling efficiency. A heat exchanger or a heat sink as a cooling alternative would make the control panel unit larger in size and higher in cost. The control panel unit 2 of the embodiment can provide the closed internal space 40 only by closing the door 14. The internal space 40 is closed to the extent that dust or oil mist is blocked. The internal space 40 is opened to the air when the door 14 is opened.

The casing structure is not limited to the FIG. 1 structure. The door 14 may be replaced by a front plate having an openable door.

The duct with fan 100 is fixed to the inner wall 20 of the casing 10 to cool the closed internal space 40. The inner wall 20 corresponding to the inner wall of the bottom plate 11 may be referred to as the bottom 21. The inner wall 20 corresponding to the inner wall of the top plate 12 may be referred to as the ceiling 22. The inner wall 20 corresponding to the inner wall of the door 14, the left-side plate 16, and the right-side plate 17 may be referred to as the upright wall 23. The upright wall 23 connects the bottom 21 with the ceiling 22. The duct 100 may comprise the exhaust duct 101 fixed on the upright wall 23 of the left-side plate 16. The duct 100 may comprise the intake duct 102 fixed on the upright wall 23 of the right-side plate 17. The exhaust duct 101 may be provided with the exhaust fan 201. The intake duct 102 may be provided with the intake fan 202. The duct 101 and 102 on the upright wall 23 each is nearer the ceiling 22 than the bottom 21.

Figure 2:
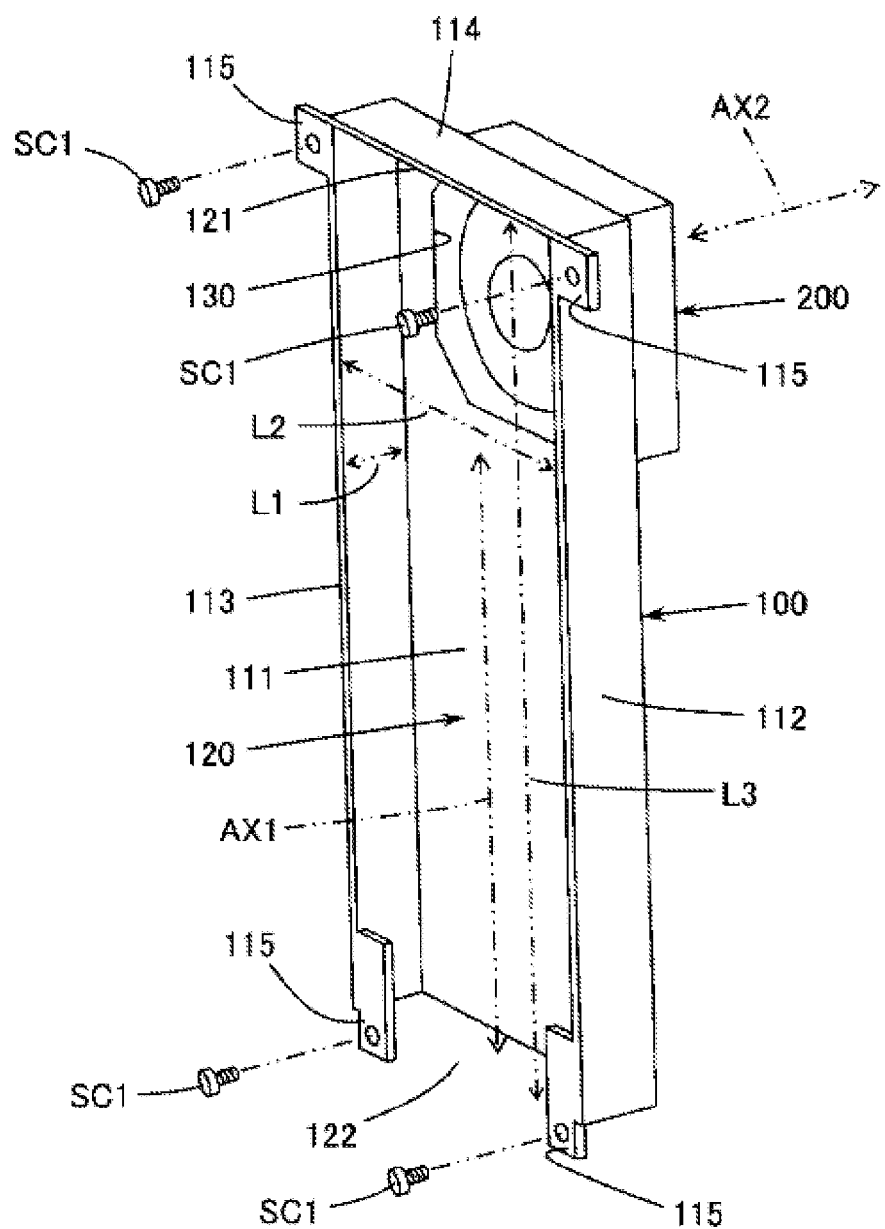
FIG. 2 is an example of a duct having a fan.
Figure 3:
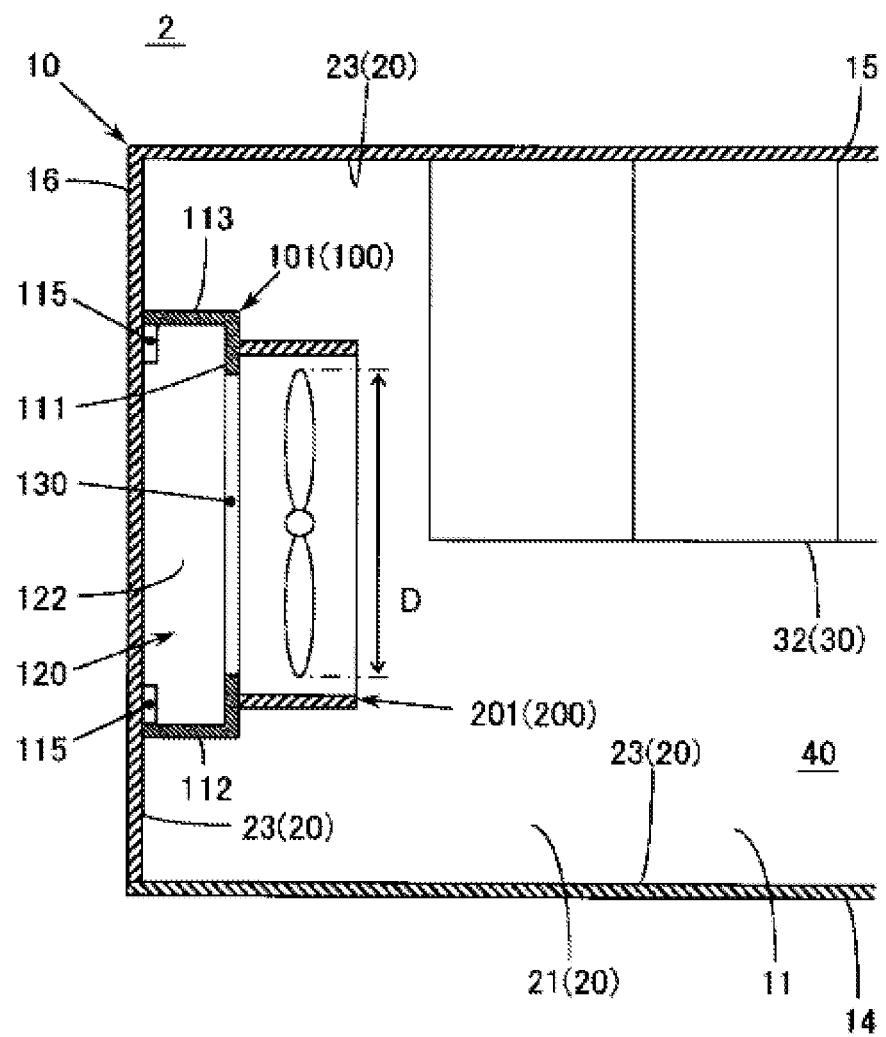
FIG. 3 schematically shows a horizontal section view of the control panel unit taken along a line passing the exhaust fan.

FIG. 2 shows an appearance of the duct with fan 100. The exhaust duct 101 and the intake duct 102 are the same in shape. The exhaust fan 201 and the intake fan 202 are the same in shape. The both ducts 101 and 102 are collectively shown as the duct 100. The both fans 201 and 202 are collectively shown as the fan 200. FIG. 3 is a horizontal section view of the control panel box 2 taken along a line passing through the exhaust fan 202. The duct 100 has the groove 120 through which the air passes and the ventilation opening 130 on which the fan 200 is mounted.

The groove 120 is formed by a wider side 111 of the duct 100 opposite the inner wall 20 and shorter sides 112 and 113 thereof opposite to each other. One end of the groove 120 is closed by a closed side 114 of the duct 100 connected to the wider side 111 and the shorter sides 112 and 113. The duct 100 has a plurality of fitting parts 115. The other end of the groove 120 is open to the internal space 40. The closed end of the groove 120 may be referred to as the closed end 121. The open end of the groove 120 may be referred to as the open end 122. The groove 120 is open to the internal space 40 to the extent that the open end 122 is apart from the opposite inner wall 20. Particularly, the open end 122 is apart from the bottom 21 as shown in FIG. 1. Part of the internal space 40 therefore exists between the open end 122 and the inner wall 20. The fitting parts 115 may comprise a pair of parts near the closed end 121 and another pair of parts near the open end 122 as shown in FIG. 2. One of the fitting parts 115 near the closed end 121 is protruded from the side 112 toward the door 14 while the other is protruded from the side 113 toward the rear plate 15. The fitting parts 115 near the open end 122 are bent from the sides 112 and 113 toward the groove 120 and protruded toward the bottom plate 11.

The ventilation opening 130 of the duct 100 is formed on the wider side 111 opposite the inner wall 20. The ventilation opening 130 is nearer the closed end 121 than the open end 122 of the groove 120. The ventilation opening 130 connects the groove 120 with the internal space 40.

The duct 100 is fixed to the inner wall 20 of the casing 10 in such manner as the groove 20 faces the inner wall 20. The groove 120 enclosed by the inner wall 20 and the duct 100 may be an air passage of the air in the internal space 40. The duct 100 may be detachably fixed to the inner wall 20 by using a screw SC1 or a bolt. A bolt may be fitted into a through-hole formed on the fitting part 115 and a through-hole formed on the casing 10 and then fastened by a nut. A screw SC1 fitted into the through-hole of the casing 10 may be screwed in a screw hole formed on the fitting part 115. The fitting direction is not limited to FIG. 2. The screw SC1 may be fitted in a opposite direction. In FIG. 1, the duct 100 is attached to an upper part of the upright wall 23 in such manner as the closed side 114 is apart from the ceiling 22.

The duct 100 may be made of metal or other materials such as resin. A metal duct would be joined to the inner wall 20 by welding the fitting parts 115. Any other methods such as a high heat resistant double-sided tape would be useful to join them.

The fan 200 is mounted on the duct 100 to cover the ventilation opening 130. The fan 200 is driven by electricity. The air (Ar) in the internal space 40 is taken into the groove 120 enclosed by the inner wall 20 and the duct 100 by the operation of the fan 200. The air flow in the AX1 direction along the groove 120 may be perpendicular to an AX2 air flow direction of the fan 200. The air flow would be smooth even when the duct is attached in a corner of the casing 10. The AX2 air flow direction of the fan 200 may necessarily cross the AX1 direction, but not necessarily be perpendicular.

The fan 200 may be the exhaust fan 201. The duct 100 may be the exhaust duct 101. The air in the internal space 40 may be taken into the groove 120 through the open end 122. The air passing down the groove 120 in the AX1 direction is exhausted to the internal space 40 through the ventilation opening 130. The exhausted air then flows in the AX2 air flow direction of the fan 201.

The fan 200 may be the intake fan 202. The duct 100 may be the intake duct 102. The air in the internal space 40 may be sucked in the ventilation opening 130 in the AX2 air flow direction. The air passing down the groove 120 in the AX1 direction is discharged to the internal space 40 through the open end 122. The air discharged from the exhaust fan 201 is delivered to the intake fan 202 when the exhaust fan 201 is opposite the intake fan 202 as shown in FIG. 1.

The outer wall of the casing 10 is exposed to the outside air of lower temperature. Heat energy of the air passing down the groove 120 is radiated to the outside air through the casing 10. The air flow in the groove 120 is accelerated near the inner wall 20. The heat transmission coefficient is improved, thereby achieving efficient heat radiation to the outside air.

The upper end 200a of the fan 200 is positioned above the upper end 32a of the amplifier 32 as shown in FIG. 1. (The upper end 200a of the fan 200 is nearer the ceiling 22 than the upper end 32a is.) Such arrangement prevents a stay of the air of higher temperature discharged from the amplifier 32. The air of higher temperature discharged from the amplifier 32 is sucked in the groove 120 of the duct 100 by the operation of the intake fan 202. Heat energy of the air passing down the groove 120 is radiated to the outside air through the casing 10. The fan 200 above the amplifier 32 may be desirably the intake fan 202. The fan 200, however, may be the exhaust fan which sends the air of lower temperature out of the groove 120 toward above the amplifier 32, preventing a stay of the air of higher temperature above the amplifier 32.

The amplifier 32 may be fixed on the back plate 15. The fan 200 of the duct 100 attached to the side-plates 16 and 17 may be desirably nearer the back plate 15 than the door 14. Such arrangement further prevents a stay of the air of higher temperature discharged from the amplifier 32.

The depth L1 of the groove 120 may be desirably smaller than the width L2 of the groove 120 to bring the air nearer the inner wall 20, thereby achieving efficient heat radiation. In FIG. 2, the depth L1 corresponds to the length of the groove 120 in the direction perpendicular to the wider side 111. The width L2 corresponds to the distance between the sides 112 and 113. The dimensions of the duct 100 may be variable according to heat emission conditions of the control panel unit. The dimensions may be defined as, for example, "L1<L2/2" or "L1<L2/3". The depth L1 may be desirably smaller than the diameter D of the fan 200. The width L2 may be desirably greater than the diameter D of the fan 200. To keep the air flow near the inner wall 20 in the groove 120, the length L3 may be desirably greater than the width L2. In FIG. 2, the length L3 corresponds to the length of the wider side 111 in the AX1 direction. The dimensions may be defined as, for example, "L3>2 X L2" or "L3>3 X L2". The length L3 may be shorter than the length of the upright wall 23 in the groove direction.

Figure 4:
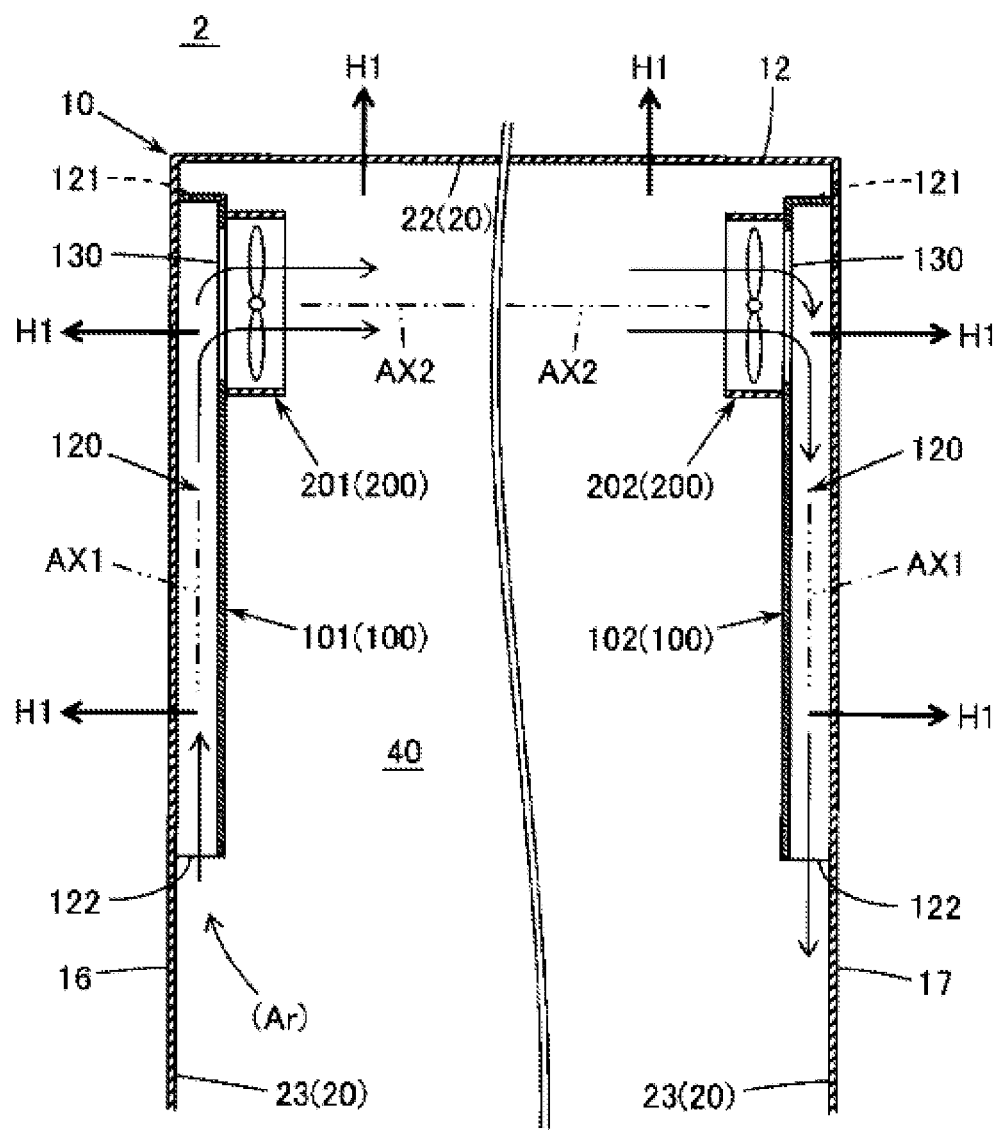
FIG. 4 schematically shows a vertical section view of a heat radiation passage of the control panel unit.

(3) Operation and Effect of the Embodiments:

The operation and the effect of the embodiments are being described referring to FIG. 1 to FIG. 4. FIG. 4 schematically shows the heat radiation passage of the control panel unit.

The air (Ar) in the internal space 40 of the casing 10 is taken into the groove 120 of the exhaust duct 101 through the open end 122 by the operation of the exhaust fan 201. The air passes down the groove 120 in the AX1 direction toward the ventilation opening 130. The outer wall of the casing 10 is exposed to the outside air of lower temperature. Heat energy of the air passing down the groove 120 is therefore radiated to the outside air through the casing 10 in the H1 direction as shown in FIG. 4. The upper air in the internal space 40 is higher in temperature than the lower air in the internal space 40. Since the exhaust duct 101 is attached on the upper part of the upright wall 23, heat energy of the air of higher temperature passing down the groove 120 is efficiently radiated to the outside air. The accelerated air flow in the groove 120 provides efficient heat radiation to the outside air.

The air flow in the AX1 direction of the groove 120 is changed to the air flow in the AX2 direction of the exhaust fan 201 after through the ventilation opening 130. The air in the internal space 40 is delivered to the intake fan 202 along the ceiling 22. Heat energy of the air is radiated to the outside air in the H1 direction through the top plate 12 as shown in FIG. 4. The upper air in the internal space 40 is higher in temperature. Heat energy of the air is efficiently radiated to the outside air. The air is taken into the groove 120 of the intake duct 102 by the operation of the intake fan 202. The air flow in the AX2 direction is changed to the air flow in the AX1 direction after through the ventilation opening 130. The air passes down the groove 120 toward the open end 122. Heat energy of the air is radiated to the outside air in the H1 direction through the right-side plate 17 as shown in FIG. 4. The intake duct 102 is attached to an upper part of the upright wall 23. The heat having higher temperature passes down the groove 120 of the intake duct 102. Heat energy of the air is efficiently radiated to the outside air. The accelerated air flow in the groove 120 provides efficient heat radiation to the outside air.

The air discharged through the open end 122 goes downward along the inner wall 23 of the right-side plate 17. Heat energy of the air is radiated to the outside air through the right-side plate 17. The air flow direction is then changed toward the exhaust duct 102. The air is taken into the groove 120 of the exhaust duct 101 through the open end 122 by the operation of the exhaust fan 201.

As described above, the wider air circulation flow C1 is generated in the casing 10. Heat energy of the air in the internal space 40 is efficiently radiated to the outside air through the casing 10. The internal space 40 is closed to prevent invasion of dust and mist. The duct 100 can be made shorter than the upright wall 23 in the AX1 direction of the groove 120. The invention eliminates the need of an expensive heat exchanger or an expensive heat sink. The invention efficiently radiates heat energy from the control panel unit 2 without providing a cooling space entirely over the control panel unit. The invention can downsize the control panel unit. The duct 100 may be detachably attached to the inner wall 20. The duct 100 may be attached in different positions according to the control panel unit 2, providing efficient heat radiation suitable for the control panel unit. The invention can further downsize the control panel unit.

(4) Modified Embodiment:

The invention may be embodied in various ways. The exhaust duct 101 provided with the exhaust fan 201 may be the only duct with fan 100 attached to the inner wall 20 of the casing 10. The intake duct 102 provided with the intake fan 202 may be the only duct with fan 100 attached to the inner wall 20 of the casing 10. The number of the duct with fan 100 is not limited to two. A single duct or three or more ducts may be applied. The duct 100 may be fixed to the upright wall 23 in such manner as the closed end 114 is apart from the ceiling. The duct 100 may be also fixed in such manner as the closed end 114 is in contact with the ceiling 22. The duct 100 may be fixed to the upright wall 23 of the side-plates 16 and 17. The duct may be fixed to any of the upright wall 23, the ceiling 22, and the bottom plate 21 of the back plate 15.

Figure 5:
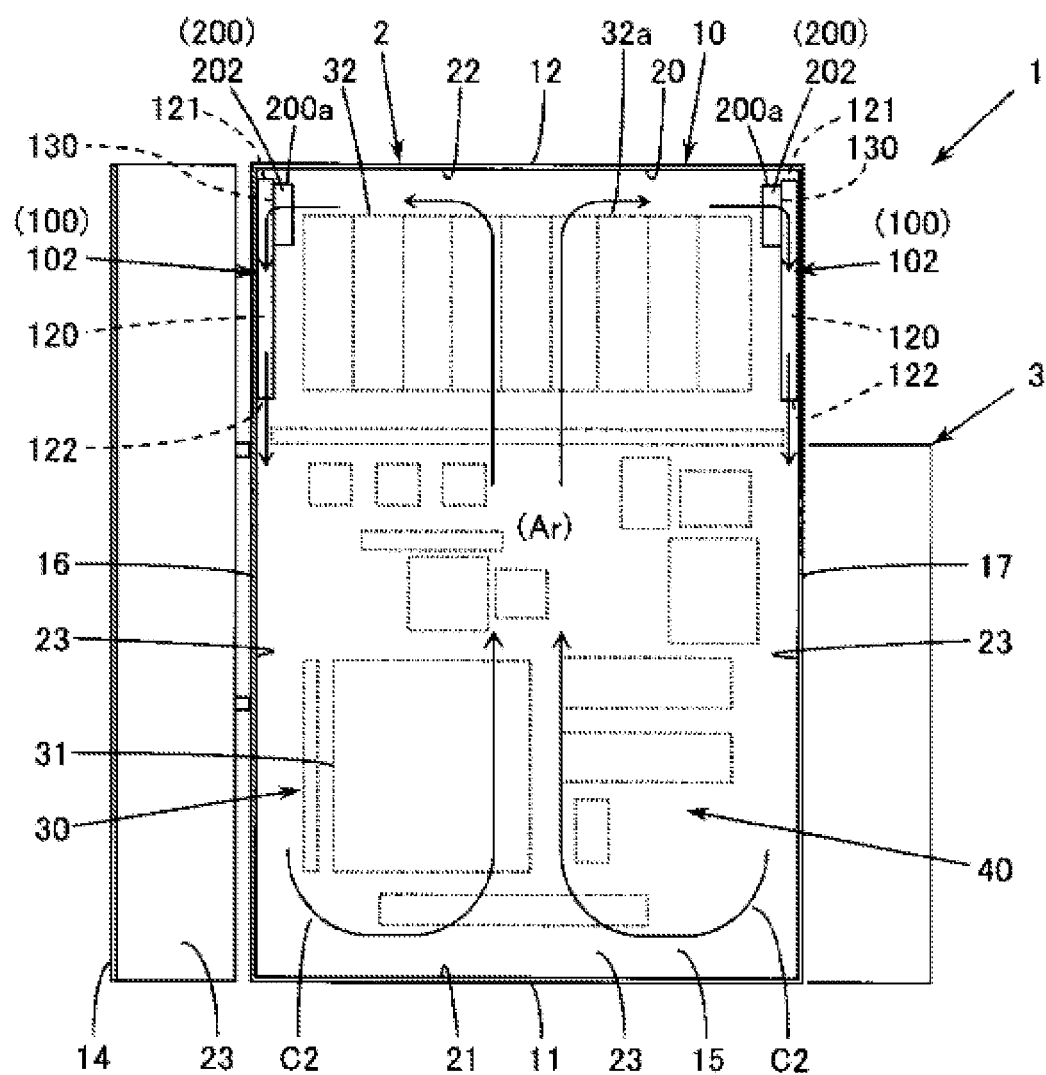
FIG. 5 schematically shows another example of the control panel unit whose door is opened.

A plurality of the intake ducts 102 may be used to generate an air circulation flow C2 in the casing 10. FIG. 5 schematically shows another example of the control panel unit 2 whose door is open. The control panel unit 2 is denoted by a dot line for ease of understanding. The embodiment in FIG. 5 is different from the embodiment in FIG. 1 in that the duct with fan 100 on the upright wall 23 of the left-side plate 16 is replaced by the intake duct 102 provided with the intake fan 202.

The air in the internal space 40 is taken into the groove 120 of the intake duct 102 attached to the left-side plate 16. The air entering the groove 120 through the ventilation opening 130 goes toward the open end 122. Heat energy of the air passing down the groove 120 is radiated to the outside air through the left-side plate 16. The air passing through the open end 122 goes downward along the upright wall 23 of the left-side plate 16 and then turns upward. The air in the internal space 40 is taken into the groove 120 of the intake duct 102 attached to the right-side plate 17. The air entering the groove 120 through the ventilation opening 130 goes toward the open end 122. Heat energy of the air passing down the groove 120 is radiated to the outside air through the right-side plate 17. The air passing through the open end 122 goes downward along the upright wall 23 of the right-side plate 17 and then turns upward.

The air circulation flow C2 is thereby generated in the casing 10. Heat energy of the air in the internal space 40 is widely radiated to the outside air through the casing 10. Efficient heat radiation from the control panel unit 2 is available without providing a cooling space entirely over the control panel unit. The embodiment can also downsize the control panel unit.

Figure 6:
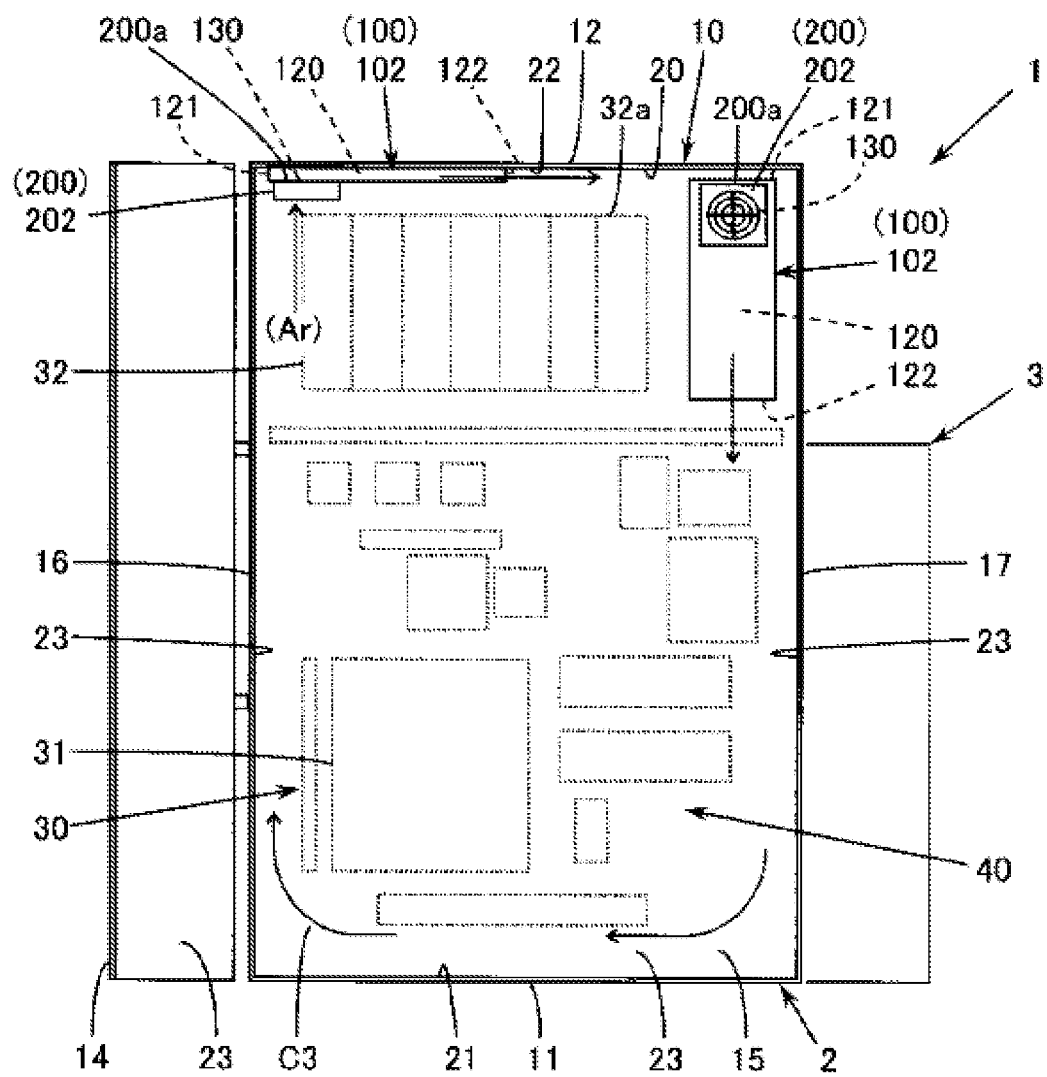
FIG. 6 schematically shows another example of the control panel unit whose door is opened.

One of the intake ducts 102 may be attached to the ceiling 22 and the other may be attached to the upright wall 23 of the back plate 15 to generate an air circulation flow C3 in the casing 10. FIG. 6 schematically shows another example of the control panel unit 2 whose door is open. The control panel unit 2 is denoted by a dot line for ease of understanding. The closed end 121 and the intake fan 202 of the intake duct 102 on the ceiling 22 is near the left-side plate 16 while the open end 122 thereof faces the upright wall 23 of the right-side plate 17. The closed end 121 and the intake fan 202 of the intake duct 102 on the upright wall 23 of the back plate 15 is near the ceiling 22 while the open end 122 thereof faces the bottom plate 21.

The air in the internal space 40 is taken into the groove 120 of the intake duct 102 attached to the ceiling 22. The air entering the groove 120 through the ventilation opening 130 goes toward the open end 122. Heat energy of the air passing down the groove 120 is radiated to the outside air through the top plate 12. The upper air in the internal space 40 is higher in temperature. Since the intake duct 102 is attached to the ceiling 22, the air passing down the groove 120 is higher in temperature, providing efficient heat radiation to the outside air. The air passing through the open end 122 goes downward along the ceiling 22 and then turns rightward. Heat energy of the air is radiated to the outside air through the top plate 12.

The air in the internal space 40 is taken into the groove 120 of the intake duct 102 attached to the upright wall 23 of the back plate 15. The air entering the groove 120 through the ventilation opening 130 goes toward the open end 122. Heat energy of the air passing down the groove 120 is radiated to the outside air through the back plate 15. The upper air in the internal space 40 is higher in temperature. Since the intake duct 102 is attached to the upper part of the upright wall 23, the air passing down the groove 120 is higher in temperature, providing efficient heat radiation to the outside air. The air passing through the open end 122 goes downward along the upright wall 23 of the back plate 15 near the right-side plate 17. Heat energy of the air is radiated to the outside air through the back plate 15. The air then turns toward the intake fan 202 and enters the groove 120 of the intake duct 102 on the ceiling 22 through the ventilation opening 130.

The air circulation flow C3 is thereby generated in the casing 10. Heat energy of the air in the internal space 40 is widely radiated to the outside air through the casing 10. Efficient heat radiation from the control panel unit 2 is available without providing a cooling space entirely over the control panel unit. The embodiment can also downsize the control panel unit.

(5) Conclusion:

The invention provides a technology capable of downsizing the control panel unit in various embodiments. A fundamental effect as above described is also available from any technology only consisting of the elements of the independent claim. The invention covers any mutually replaced or modified configuration in the embodiments or prior art.

What is claimed is:

1. A control panel unit for a machine tool comprises:
an openable door;
a casing which closes an internal space in which a control device is arranged when the door is closed;
a duct structure having a groove and a ventilation opening, the groove being closed at a closed end and open to the internal space at an open end, the ventilation opening being provided nearer the closed end of the groove to connect the groove with the internal space, and the duct structure being fixed to an inner wall of the casing in such manner as the groove faces the inner wall of the casing; and
a fan structure mounted on the ventilation opening,
wherein the fan structure comprises an exhaust fan which discharges air from the groove to the internal space through the ventilation opening and an intake fan which takes the air in the internal space into the groove through the ventilation opening, wherein the duct structure comprises an exhaust duct provided with the exhaust fan and an intake duct provided with the intake fan, and wherein the intake duct is fixed to the inner wall in such manner as the intake fan is opposite the exhaust fan,
wherein the air in the internal space is taken into the groove enclosed by the inner wall and the duct structure by the operation of the fan structure,
wherein, in a state that the door is closed, the air in the internal space is circulated to release heat of the internal space to an external space through the casing.

2. The control panel unit of claim 1, wherein the inner wall comprises a bottom, a ceiling, and an upright wall connecting the bottom and the ceiling, and wherein the duct structure is fixed to at least one of the ceiling and a part of the upright wall nearer the ceiling than the bottom.

3. The control panel unit of claim 1, wherein the duct structure is detachably fixed to the inner wall.

4. The control panel unit of claim 2, wherein the duct structure is detachably fixed to the inner wall.

5. The control panel unit of claim 1, wherein the control device includes an amplifier which activates a driven member, and wherein an upper end of the fan structure is positioned above an upper end of the amplifier.

6. The control panel unit of claim 2, wherein the control device includes an amplifier which activates a driven member, and wherein an upper end of the fan structure is positioned above an upper end of the amplifier.

7. The control panel unit of claim 3, wherein the control device includes an amplifier which activates a driven member, and wherein an upper end of the fan structure is positioned above an upper end of the amplifier.

8. The control panel unit of claim 4, wherein the control device includes an amplifier which activates a driven member, and wherein an upper end of the fan structure is positioned above an upper end of the amplifier.

* * * * *